(12) United States Patent
Chen et al.

(10) Patent No.: US 10,147,829 B2
(45) Date of Patent: Dec. 4, 2018

(54) DIELECTRIC SIDEWALL STRUCTURE FOR QUALITY IMPROVEMENT IN GE AND SIGE DEVICES

(71) Applicant: Taiwan Semiconductor Manufacturing Co., Ltd., Hsin-Chu (TW)

(72) Inventors: Chih-Ming Chen, Hsinchu (TW); Lee-Chuan Tseng, New Taipei (TW); Ming Chyi Liu, Hsinchu (TW); Po-Chun Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/273,880

(22) Filed: Sep. 23, 2016

(65) Prior Publication Data

US 2018/0090631 A1   Mar. 29, 2018

(51) Int. Cl.
| | | |
|---|---|---|
| *H01L 31/02* | (2006.01) | |
| *H01L 31/05* | (2014.01) | |
| *H01L 31/18* | (2006.01) | |
| *H01L 31/028* | (2006.01) | |
| *H01L 31/103* | (2006.01) | |
| *H01L 31/0216* | (2014.01) | |
| *H01L 31/0312* | (2006.01) | |
| *H01L 31/0352* | (2006.01) | |
| *H01L 31/105* | (2006.01) | |

(52) U.S. Cl.
CPC .... *H01L 31/035281* (2013.01); *H01L 31/028* (2013.01); *H01L 31/02019* (2013.01); *H01L 31/02161* (2013.01); *H01L 31/0312* (2013.01); *H01L 31/103* (2013.01); *H01L 31/105* (2013.01); *H01L 31/1037* (2013.01); *H01L 31/1808* (2013.01); *H01L 31/1812* (2013.01)

(58) Field of Classification Search
CPC ....... H01L 31/035281; H01L 31/02019; H01L 31/02161; H01L 31/1808; H01L 31/1812; H01L 31/0312
See application file for complete search history.

(56) References Cited

U.S. PATENT DOCUMENTS

| | | |
|---|---|---|
| 5,994,724 A | 11/1999 | Morikawa |
| 6,075,253 A | 6/2000 | Sugiyama et al. |
| (Continued) | | |

*Primary Examiner* — Kenneth Parker
*Assistant Examiner* — Long H Le
(74) *Attorney, Agent, or Firm* — Eschweiler & Potashnik, LLC

(57) ABSTRACT

Some embodiments relate to an integrated circuit (IC) disposed on a silicon substrate, which includes a well region having a first conductivity type. A dielectric layer is arranged over an upper surface of the silicon substrate, and extends over outer edges of the well region and includes an opening that leaves an inner portion of the well region exposed. An epitaxial pillar of SiGe or Ge extends upward from the inner portion of the well region. The epitaxial pillar includes a lower epitaxial region having the first conductivity type and an upper epitaxial region having a second conductivity type, which is opposite the first conductivity type. A dielectric sidewall structure surrounds the epitaxial pillar and has a bottom surface that rests on an upper surface of the dielectric layer.

20 Claims, 11 Drawing Sheets

(56) References Cited

U.S. PATENT DOCUMENTS

| | | | |
|---|---|---|---|
| 2010/0025738 A1* | 2/2010 | Kohyama | H01L 27/14603 |
| | | | 257/222 |
| 2010/0330727 A1 | 12/2010 | Hill et al. | |
| 2014/0001592 A1 | 1/2014 | Yamabi et al. | |
| 2015/0108596 A1 | 4/2015 | Meade | |
| 2016/0141329 A1 | 5/2016 | Cheng et al. | |
| 2016/0247841 A1* | 8/2016 | Cheng | H01L 31/036 |
| 2017/0338147 A1* | 11/2017 | Chang | H01L 21/76831 |

* cited by examiner

DIELECTRIC SIDEWALL STRUCTURE FOR QUALITY IMPROVEMENT IN GE AND SIGE DEVICES

BACKGROUND

Semiconductor devices based on silicon, such as transistors and photodiodes, have been widely used for the past three decades. In recent years, semiconductor devices based on alternative materials, such as germanium, are becoming more widely used because they can offer advantages over silicon-based semiconductor devices. For example, pure germanium (Ge) as well as its silicon alloys (hereinafter "SiGe"), which exhibit a molar ratio of silicon to germanium according to $Si_{1-x}Ge_x$, may be advantageous in the area of photodetectors, because their bandgaps are more adjustable than those of silicon-only materials. This allows SiGe devices to more efficiently capture photons and makes SiGe devices attractive in the area of photodetectors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
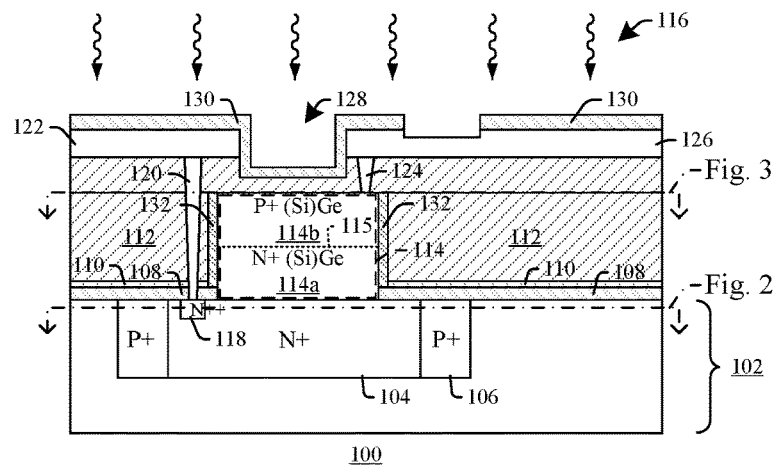
FIG. 1 illustrates a cross-sectional view of some embodiments of a semiconductor structure having an epitaxial pillar, which includes a pn junction photodetector, with a dielectric sidewall structure along sidewalls of the epitaxial pillar.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Photodetectors, such as photodiodes, are used in a variety of electronic devices, such as digital cameras, smart phones, and optical sensors, among others. High-quality photodetectors often include a region of epitaxially-grown semiconductor material disposed over a semiconductor substrate. To form the epitaxially-grown semiconductor material, a resist protective oxide (RPO) layer is formed over an upper surface of the semiconductor substrate, a silicon nitride layer is formed over the RPO layer, and a dielectric layer, such as un-doped silicate glass (USG), is formed over the silicon nitride layer. In some conventional approaches, a plasma etch is then carried out with a mask in place to form a recess through each of the dielectric layer, silicon nitride layer, and RPO layer, thereby exposing an upper surface of the semiconductor substrate. The semiconductor material corresponding to a photodetector is grown in the recess. However, the present disclosure appreciates that physical bombardment of ions in the plasma etch can damage the exposed upper surface of the semiconductor substrate, for example by causing small fractures or dislocations, and can thus change the previously monocrystalline structure of the semiconductor substrate to a polycrystalline lattice structure. When the epitaxially-grown semiconductor material is formed on this damaged region of the semiconductor substrate to establish the photodetector, the resultant device may suffer from undesirable leakage due to the underlying fractures/dislocations.

Other conventional approaches terminate the plasma etch after a recess has been partially formed but before the upper surface of the semiconductor substrate is exposed, and then use a wet etch to remove the final portion of the RPO layer to expose the upper surface of the semiconductor substrate. While this alternative approach can avoid or limit plasma damage to the upper substrate surface, aspects of this disclosure appreciate that using this wet etch to remove the RPO layer can "undercut" the silicon nitride layer. When the semiconductor material corresponding to a photodetector is grown with this "undercut" in place, the "undercut" can lead fill issues in which the semiconductor material does not completely fill outermost portions of the recess under outer edges of the silicon nitride layer. Thus, this wet etch approach can also lead to less than optimal device characteristics.

The present disclosure provides devices and methods that improve device characteristics of photodiodes over conventional approaches. In particular, some embodiments of the present disclosure provide semiconductor devices that include a pillar of epitaxial semiconductor material that corresponds to a photodiode. This pillar of semiconductor material contacts an upper surface of the underlying semiconductor substrate with little or no plasma damage, and is surrounded by a dielectric sidewall structure that is configured to prevent and/or significantly limit "undercut" during manufacture of the device. Thus, the semiconductor devices disclosed can provide better device characteristics than conventional approaches in some regards.

Figure 2:
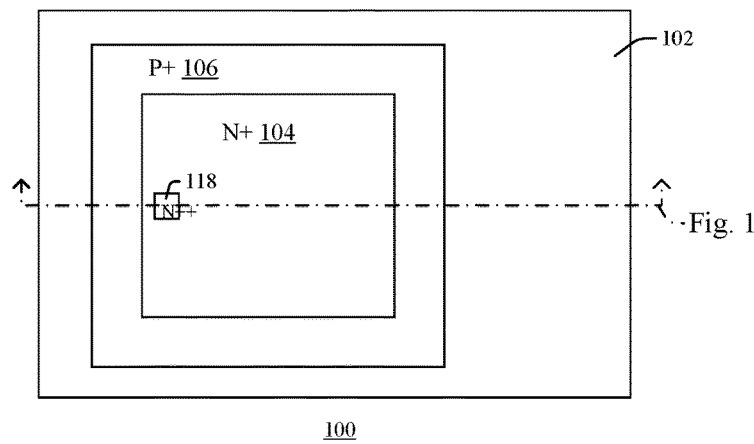
FIG. 2 illustrates a top view of FIG. 1's semiconductor structure taken along the cross-sectional line as shown in FIG. 1.
Figure 3:
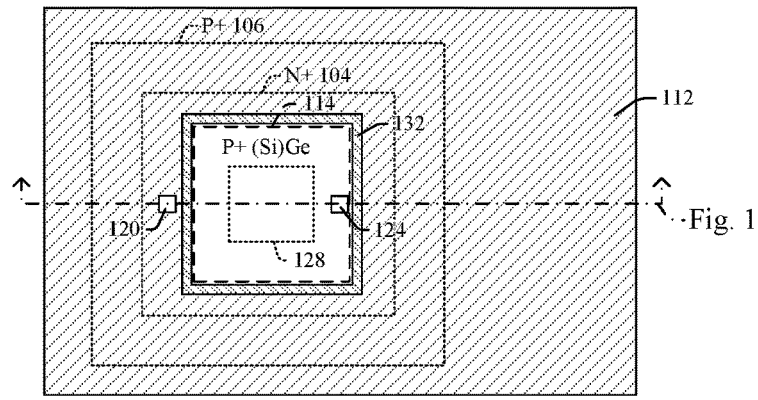
FIG. 3 illustrates a top view of FIG. 1's semiconductor structure taken along the cross-sectional line as shown in FIG. 1.

FIG. 1 illustrates a cross-sectional view of an integrated circuit (IC) 100 in accordance with some embodiments; while FIGS. 2-3, which are now described in concurrently with FIG. 1 as shown by the cross-sectional lines in FIGS. 1-3, illustrate top views of the FIG. 1's IC 100 at various depths. The IC 100 includes a substrate 102 including a well region 104 having a first conductivity type (e.g., n-type) which is laterally surrounded by an isolation region 106. In some embodiments, the substrate 102 is a monocrystalline silicon substrate or a silicon-on-insulator (SOI) substrate, and the isolation region 106 is a well region having a second conductivity type (e.g., p-type) opposite the first conductivity type. A dielectric layer 108, which can manifest as an RPO layer in some embodiments, is arranged over an upper surface of the substrate 102. The dielectric layer 108 extends over outer edges of the well region 104 and covers isolation region 106, and includes an opening that leaves an inner portion of the well region 104 exposed. A silicon nitride layer 110 is disposed over the dielectric layer 108, and a low-κ dielectric layer 112 is disposed over the silicon nitride layer 110. An epitaxial pillar 114, which is made of pure Ge or a SiGe alloy having a monocrystalline lattice, extends upward from the inner portion of the well region 104 and through the opening in the dielectric layer 108.

The epitaxial pillar 114 includes a lower epitaxial region 114a having the first conductivity type and an upper epitaxial region 114b having the second conductivity type. The upper and lower epitaxial regions 114a, 114b meet at a junction 115 to establish a photodiode. When an impingent photon 116 of sufficient energy strikes the photodiode, an electron-hole pair is created, and the carriers of the pair are swept across the junction 115 by a built-in electric field within the photodiode. Thus, when the IC 100 is exposed to photons 116 of sufficient energy, a photocurrent is produced in which holes move toward an anode of the device (for example from junction 115, through lower epitaxial region 114a, through well region 104, through highly doped well contact region 118, up lower contact 120, and through first conductive line 122), and in which electrons move toward a cathode of the device (for example, from junction 115, though upper epitaxial region 114b, through upper contact 124, and through second conductive line 126). In some embodiments, the first and second conductive lines 122, 126 are aluminum copper interconnect lines disposed over the substrate 102, and are arranged to include a window opening 128 aligned over an upper surface of the epitaxial pillar 114 and through which the incident photons 116 may pass to reach the epitaxial pillar 114 and its corresponding photodiode. An anti-reflective coating (ARC) 130, such as a silicon nitride coating, is disposed over the first and second conductive lines 122, 126 and lines the sidewalls and lower surface of window opening 128.

Notably, a dielectric sidewall structure 132 laterally surrounds the epitaxial pillar 114 and has a bottom surface that rests on an upper surface of the dielectric layer 108, such that the dielectric sidewall structure 132 and dielectric layer 108 collectively line the full height of sidewalls of the epitaxial pillar 114. In some embodiments, the dielectric layer 108 and dielectric sidewall structure 132 have the same dielectric material composition as one another. For example, in some embodiments the dielectric layer 108 and dielectric sidewall structure 132 are both made of silicon dioxide ($SiO_2$) and can have equal etching rates for a predetermined etch. In other embodiments, the dielectric layer 108 and dielectric sidewall structure 132 are made of materials that exhibit slightly different etch rates, for example, but which are within 35% of one another, within 10% of one another, or even within 5% of one another for a predetermined etch. Thus, the dielectric layer 108 can have a first etch rate and the dielectric sidewall structure 132 can have a second, slightly different etch rate, wherein the first etch rate can be between 70% and 130% of the second etch rate in some embodiments, or even between 95% and 105% of the second etch rate in other embodiments. For example, in some other embodiments, dielectric layer 108 and/or dielectric sidewall structure 132 can be made of silicon nitride $Si_3N_4$, and can be formed by plasma enhanced chemical vapor deposition (PECVD) or can be thermally grown.

As will be appreciated further herein, during manufacturing, the dielectric sidewall structure 132 helps limit etching damage to the upper surface of the well region 104 and, because the etching rates of the dielectric layer 108 and dielectric sidewall structure 132 are the same or similar, helps prevent the dielectric layer 108 from undercutting the silicon nitride layer 110. In this way, the epitaxial pillar 114 can be formed with outer sidewalls that are planar or substantially planar, and which are vertical or substantially vertical to facilitate good filling by epitaxial growth without gaps or voids. Although the epitaxial pillar 114 and dielectric sidewall structure 132 are illustrated as being square or rectangular as viewed from above, it will be appreciated that in other embodiments the epitaxial pillar 114 and dielectric sidewall structure 132 can be circular, oval, or polygonal in shape as viewed from above, and/or can have square corners or rounded corners as viewed from above. Further, although FIG. 1 illustrates an example where the lower epitaxial region 114a is n-type and the upper epitaxial region 114b is p-type, in other embodiments the lower epitaxial region 114a can be p-type and the upper epitaxial region 114b can be n-type, provided the conductivity types of the other regions is correspondingly transposed.

The dielectric sidewall structure 132 has innermost sidewalls that are aligned with innermost sidewalls of the dielectric layer 108. The dielectric sidewall structure 132 also separates an inner sidewall of the silicon nitride layer 110 from an outer sidewall of the epitaxial pillar 114, which helps limit or prevent undercut of the silicon nitride layer 110. A lower surface of the dielectric sidewall structure 132 is co-planar with a lower surface of the silicon nitride layer 110 in some embodiments, and an upper surface of the low-κ dielectric layer 112 is co-planar with both an upper surface of the dielectric sidewall structure 132 and an upper surface of the epitaxial pillar 114 in some embodiments. In some embodiments, the dielectric layer 108 acts as an RPO layer, which is a silicide-blocking layer to maintain a resistivity of the underlying silicon substrate and/or to maintain a resistivity of a polysilicon layer over the underlying silicon substrate. For example, if the IC 100 includes a polysilicon resistor, the RPO layer can be patterned to remain in place over the polysilicon resistor and also overlie regions of the substrate 102. Thus, when silicide is formed over other regions of the IC, such as on source/drain regions and/or gate electrodes for example to form ohmic contacts, the RPO layer is left in place over the polysilicon resistor to prevent the silicide from contacting the polysilicon resistor, and thereby maintaining the resistance of the polysilicon resistor.

Figure 4:
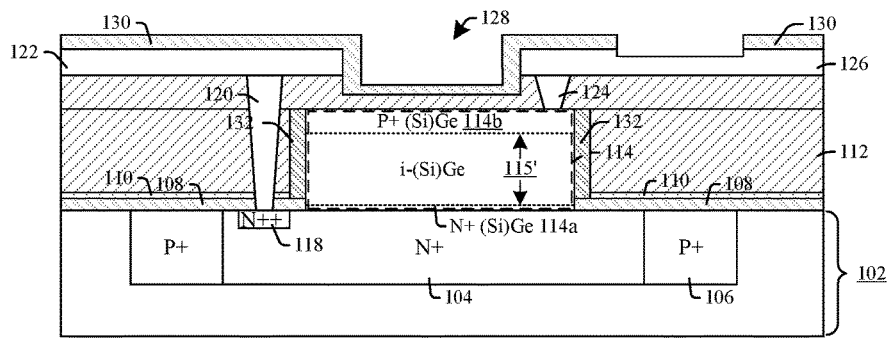
FIG. 4 illustrates a cross-sectional view of some embodiments of a semiconductor structure having an epitaxial pillar, which includes a pin junction photodetector, with a dielectric sidewall structure along sidewalls of the epitaxial pillar.

FIG. 4 shows a cross-sectional view of some embodiments, wherein the epitaxial pillar 114 further comprises an intrinsic region of pure Ge or an intrinsic region of SiGe alloy separating the lower epitaxial region 114a from the upper epitaxial region 114b. Thus, in FIG. 4, the photodiode includes a lower epitaxial region 114a that is n-type, an intermediate region 115' that is intrinsic Ge or SiGe, and an upper epitaxial region 114b that is p-type; although the p-type and n-type doping could be transposed in other embodiments. In FIG. 4, a lowermost portion of the intrinsic region 115' has a first height, as measured from an upper surface of the substrate 102, and a lowermost portion of the silicon nitride layer 110 has a second height that is less than the first height, although the thickness of the lower epitaxial region 114a could be altered in other embodiments to change the first height to be greater than that of the silicon nitride layer 110.

Figure 5:
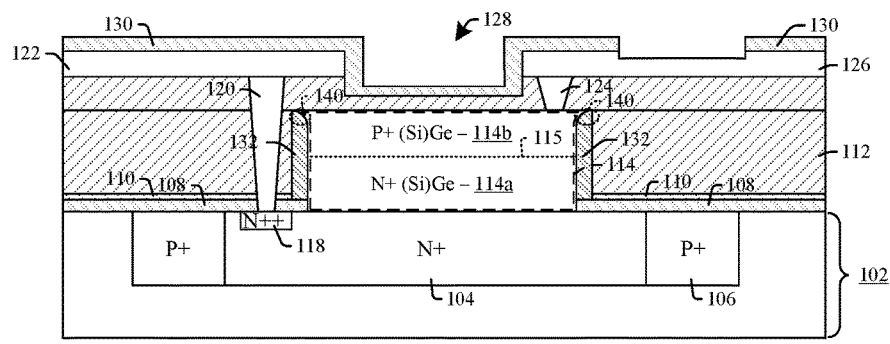
FIG. 5 illustrates a cross-sectional view of some embodiments of a semiconductor structure having an epitaxial pillar, which includes a photodetector, with a dielectric sidewall structure having rounded upper corners.

FIG. 5 shows a cross-sectional view of some embodiments, wherein inner sidewalls of the dielectric sidewall structure 132 have rounded upper surfaces 140, and where an upper surface of the epitaxial pillar 114 flares outward over the rounded upper surfaces. Thus, in FIG. 5, an uppermost portion of the epitaxial pillar 114 flares outward relative to lower or intermediate portions of the epitaxial pillar 114 to cover the rounded upper surfaces 140 of the dielectric sidewall structure 132.

Figure 6:
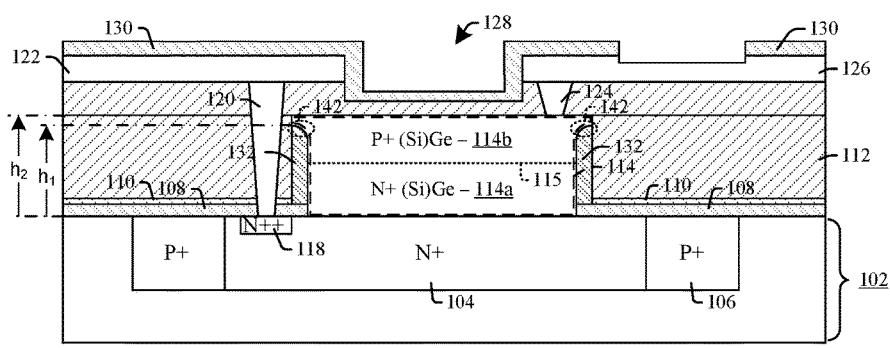
FIG. 6 illustrates a cross-sectional view of some embodiments of a semiconductor structure having an epitaxial pillar, which includes a photodetector, with a dielectric sidewall structure having rounded upper corners.

As shown in FIG. 6, in some embodiments, an uppermost surface of the dielectric sidewall structure 132, which can exhibit rounded corners 142, can be spaced apart vertically from an uppermost planar surface of the low-κ dielectric layer 112. Thus, in some embodiments, the uppermost surface of the dielectric sidewall structure 132 can have a first height, $h_1$, as measured from the upper surface of the substrate 102; and the uppermost surface of the low-κ dielectric layer 112 can have a second height, $h_2$, as measured from the upper surface of the substrate 102, wherein the second height, $h_2$, is greater than the first height, $h_1$.

With reference to FIGS. 7-19, a series of cross-sectional views of some embodiments of a semiconductor device with a dielectric sidewall structure at various stages of manufacture are provided.

Figure 7:
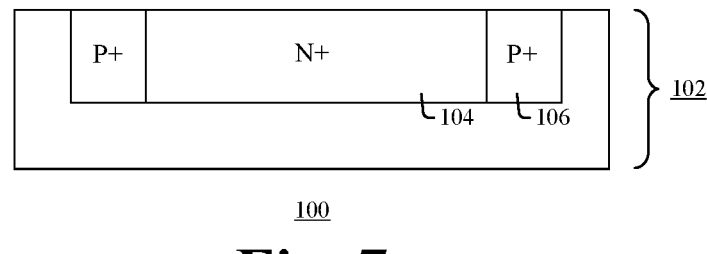
FIGS. 7-19 illustrate a series of cross-sectional views of some embodiments of a semiconductor structure at various stages of manufacture.

As illustrated by FIG. 7, a substrate 102 is provided. In some embodiments, the substrate 102 is a bulk silicon substrate made of monocrystalline silicon. When the substrate 102 is silicon, the substrate 102 can be n-type, p-type, or intrinsic silicon. In other embodiments, the substrate 102 may be other suitable materials, for example, a silicon carbide substrate, a sapphire substrate, or a semiconductor-on-insulator (SOI) substrate, which can be doped p-type or n-type, and/or may have, for example, a thickness of between about 800-2000 nanometers. In still other embodiments, the substrate 102 can include e a binary semiconductor material (e.g., GaAs), tertiary semiconductor material (e.g., InGaAs), or other semiconductor material.

A well region 104, which has a first conductivity type, is formed in the substrate 102 by forming a well mask (not shown), such as an oxide, hardmask, and/or photoresist layer for example, over an upper surface of the substrate 102. The well mask leaves a portion of the upper substrate surface, which corresponds to the well region 104, exposed; and covers other portions of the upper substrate surface. With the well mask in place, ions are implanted into the substrate 102 to form the well region 104, or a highly doped layer is formed over the substrate 102 and then dopants are out-diffused from the highly doped layer into the substrate 102 to form the well region 104.

An isolation region 106, which can have a second conductivity type opposite the first conductivity type, is formed in the substrate 102 by forming an isolation mask (not shown), such as an oxide, hardmask, and/or photoresist layer for example, over the upper surface of the substrate 102. The isolation mask leaves a portion of the upper substrate surface, which corresponds to the isolation region 106, exposed; and covers other portions of the upper substrate surface. With the isolation mask in place, ions are implanted into the substrate to form the isolation region 106, or a highly doped layer is formed over the substrate and then dopants are out-diffused from the highly doped layer into the substrate to form the isolation region 106. The isolation region 106 may be formed prior to the well region, or vice versa, depending on the implementation.

Figure 8:
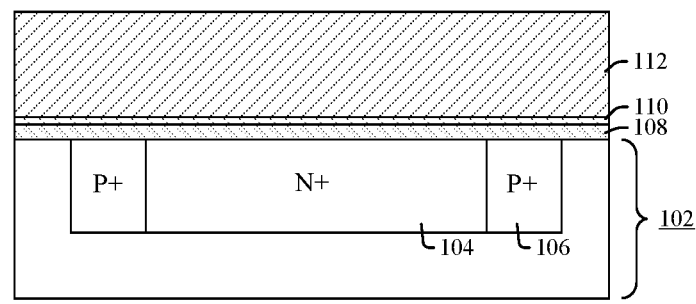

As illustrated by FIG. 8, a dielectric layer 108, which can act as an RPO layer in some embodiments, is formed over the upper surface of the substrate 102; and a silicon nitride layer 110, which can act as an etch stop layer in some embodiments, is formed over the dielectric layer 108. A low-κ dielectric layer 112, such as a USG or fluorosilicate glass (FSG) layer for example, is then formed over the silicon nitride layer 110.

Figure 9:
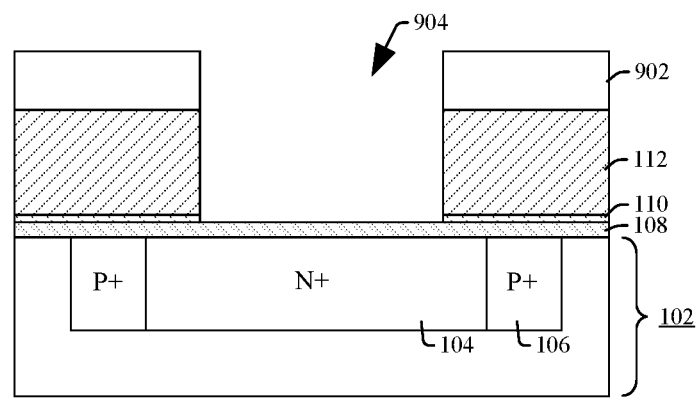

As illustrated by FIG. 9, a pillar mask 902, which can be made of photoresist material and/or a hardmask for example, is patterned over the low-κ dielectric layer 112 by using photolithography techniques. The pillar mask 902 extends over an upper surface of the low-κ dielectric layer 112, and includes an opening that leaves a portion of the low-κ dielectric layer exposed. With the pillar mask 902 in place, an etch is carried out to remove the exposed portion of the low-κ dielectric layer 112 and corresponding portions of the silicon nitride layer 110. The etch stops on an upper surface of the dielectric layer 108, thereby forming a first recess 904. In some embodiments, the first recess has width of approximately 1 micrometer, a length ranging from 1 micrometer to about 30 micrometers, and a height of approximately 30 micrometers. In some embodiments, the etch carried out in FIG. 9 is a plasma etch that includes $C_4F_4$, $O_2$, and Ar gas species included in a plasma chamber, under an applied power ranging from 1000 watts to 8000 watts, for example.

Figure 10:
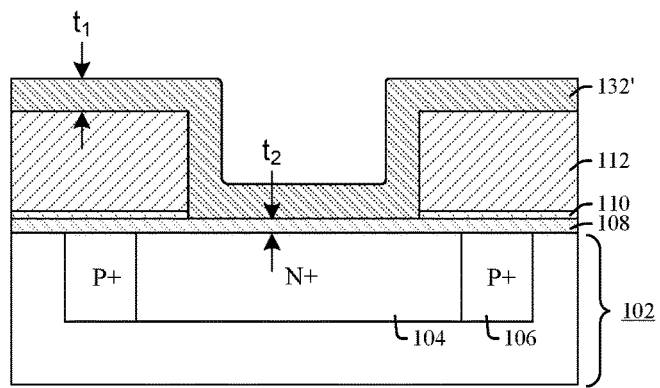

As illustrated by FIG. 10, a conformal dielectric liner 132' is then formed over an upper surface and sidewalls of the low-κ dielectric layer 112, along sidewalls of the silicon nitride layer 110, and over the upper surface of the dielectric layer 108 to partially fill the first recess 904. In some embodiments, the conformal dielectric liner 132' has a first thickness, $t_1$, and the dielectric layer has a second thickness, $t_2$, wherein the first thickness $t_1$ is greater than the second thickness, $t_2$. For example, in some embodiments, the first thickness $t_1$ can range from 10 angstroms to 2000 angstroms; and the second thickness $t_2$ can be less than the first thickness $t_1$. In some embodiments, the conformal dielectric liner 132' is made of $SiO_2$, and can be formed by spin-on techniques, chemical vapor deposition (CVD), physical vapor deposition (PVD), plasma enhanced CVD (PECVD), or other techniques.

Figure 11:
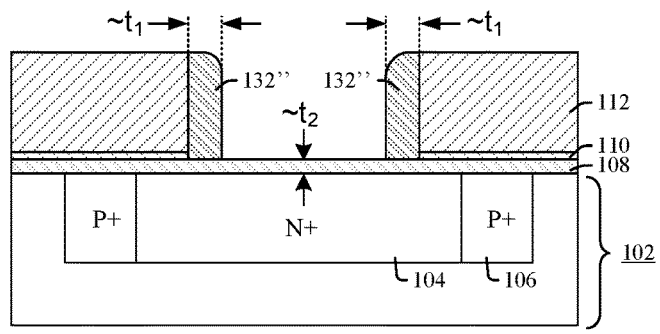

As illustrated by FIG. 11, an anisotropic or vertical etch is carried out with the conformal dielectric liner 132' in place to remove portions of the conformal dielectric liner 132' from the upper surface of the low-κ dielectric layer 112 and from the upper surface of the dielectric layer 108. Thus, this anisotropic or vertical etch etches back the conformal dielectric liner 132' to leave a portion of the conformal dielectric liner as a dielectric sidewall precursor structure 132" along sidewalls of the low-κ dielectric layer 112 and along sidewalls of the silicon nitride layer 110, and leaves an upper surface region of the dielectric layer 108 exposed. Because of the characteristics of the anisotropic or vertical etch used, the dielectric sidewall precursor structure 132" still has a thickness which is at least substantially equal to $t_1$, and which is greater than the remaining thickness (~$t_2$) of the dielectric layer 108. In some embodiments, the etch carried out in FIG. 11 is a dry etch process carried out for a predetermined time, and this etch includes $C_4F_4$, $O_2$, and Ar gas species included in a plasma chamber, for example.

Figure 12:
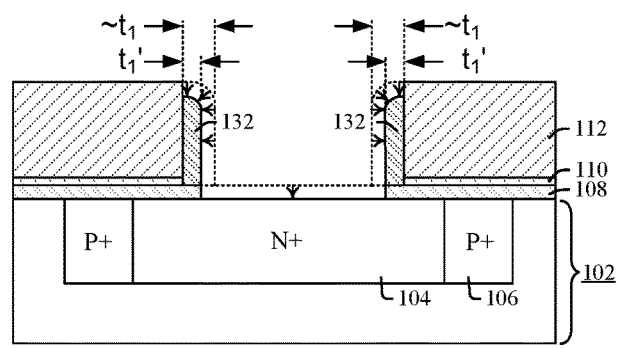

As illustrated by FIG. 12, an isotropic or wet etch is then carried out to thin the dielectric sidewall precursor structure (132" of FIG. 11) to thickness $t_1'$ and concurrently remove the exposed upper surface region of the dielectric layer 108. In this way, a dielectric sidewall structure 132 can be formed, which has sidewalls that are aligned with sidewalls of dielectric layer 108, through which upper surface of well region 104 is exposed. In some embodiments, carrying out the isotropic or wet etch corresponds to dipping the substrate into an aqueous solution of dilute hydrofluoric acid for a predetermined time. The dielectric sidewall structure 132 can have rounded upper surfaces, which may be approximately even with an upper surface of the low-κ dielectric layer 112 or which may be spaced below the upper surface of the low-κ dielectric layer 112. Due to the manner in which the etch is carried out to form the dielectric sidewall structure 132, the exposed upper surface of the well region 104 is free of damage at this stage—for example, the upper surface of the well region is a monocrystalline surface region with little or no dislocations or fractures. Further, because the dielectric sidewall structure 132 still remains in place over the inner sidewall of the silicon nitride layer 110, the recess in FIG. 12 can have vertical or substantially vertical sidewalls, and the dielectric layer 108 does not undercut the silicon nitride layer 110 as could occur in some conventional approaches.

In some embodiments of FIG. 12, the dielectric sidewall precursor structure (132" of FIG. 11) and dielectric layer 108 have the same dielectric material composition as one another, and thus are etched at equal rates to yield sidewalls that are aligned, planar, and/or substantially planar for the resultant etched structure, as shown in FIG. 12. In other embodiments, the dielectric sidewall precursor structure (132" of FIG. 11) and dielectric layer 108 can have slightly different etch rates. For example, the dielectric sidewall precursor structure can have a first etch rate and the dielectric layer 108 can have a second etch rate that differs from the first etch rate for the isotropic or wet etch. Often in such embodiments, the first etch rate will be slightly greater than the second etch rate, for example by less than thirty percent, such that the dielectric layer 108 does not undercut the silicon nitride layer 110 and the recess formed by the etch will be wider at its upper portions to facilitate better filling without gaps or voids.

Figure 13:
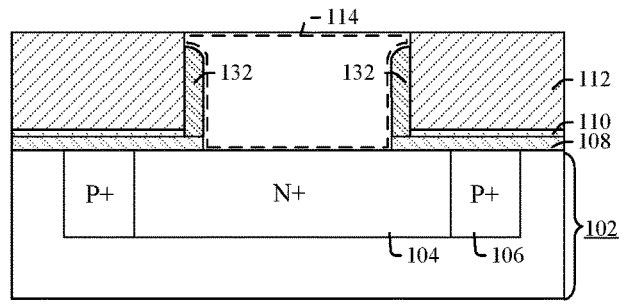

As illustrated by FIG. 13, an epitaxial pillar 114 of Si or SiGe material is epitaxially grown directly on the undamaged well region 104 without voids or gaps. The epitaxial growth process used to form the epitaxial pillar 114 initially uses a first set of epitaxial growth conditions to form a lower epitaxial region that corresponds to an n-type region of monocrystalline germanium or monocrystalline SiGe. The epitaxial growth conditions are then changed to form an upper epitaxial region that corresponds to a p-type region of monocrystalline Ge or monocrystalline SiGe that directly contacts the n-type region at a p-n junction. In other embodiments, rather than the p-type region directly contacting the n-type region at a p-n junction, the epitaxial growth process is used to form an intrinsic region of Ge or an intrinsic region of SiGe between the p-type region and n-type region, such that a p-i-n junction is formed. In other embodiments, the p-type region can be formed before the n-type region. In embodiments where the dielectric sidewall structure 132 has rounded upper surfaces, the epitaxial pillar 114 can be grown to flare out overtop the rounded upper surfaces. In other embodiments, rather than a Ge or SiGe epitaxial material being grown for the epitaxial pillar 114, other materials, such as monocrystalline silicon, a binary semiconductor material (e.g., GaAs), tertiary semiconductor material (e.g., InGaAs), or other semiconductor material can be grown to form the epitaxial pillar 114.

Figure 14:
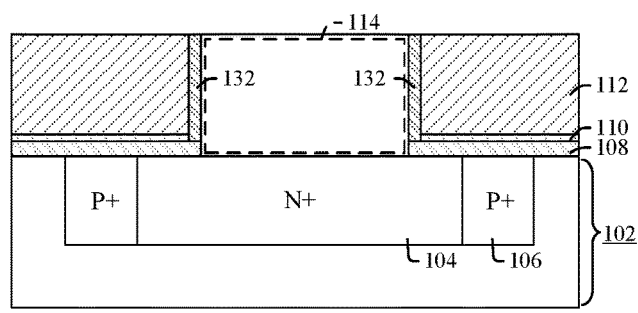

As illustrated by FIG. 14, chemical mechanical planarization (CMP) can be optionally performed so the dielectric sidewall structure 132 has a planar upper surface. This planar upper surface is co-planar with an uppermost surface of the epitaxial pillar 114 and is co-planar with an upper surface of low-κ dielectric layer 112. Although this CMP operation is optional, the subsequent figures are illustrated as continuing from FIG. 14, but it will be appreciated that the subsequent figures could equivalently follow from FIG. 13 (e.g., with upper portions of epitaxial pillar 114 still flaring out over upper surface of dielectric sidewall structure 132).

Figure 15:
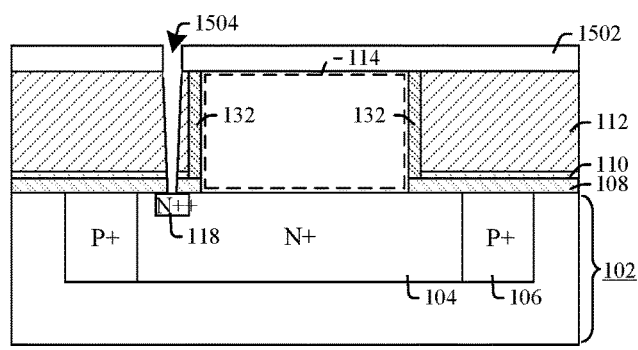

As illustrated by FIG. 15, contact opening mask 1502 is formed, and an etch is carried out to form a contact opening 1504 extending downward through the low-κ dielectric layer 112 to expose an upper surface of substrate 102. An ion implantation process can then be carried out so a stream of molecules or charged ions pass through the contact opening to form a highly doped well contact region 118.

Figure 16:
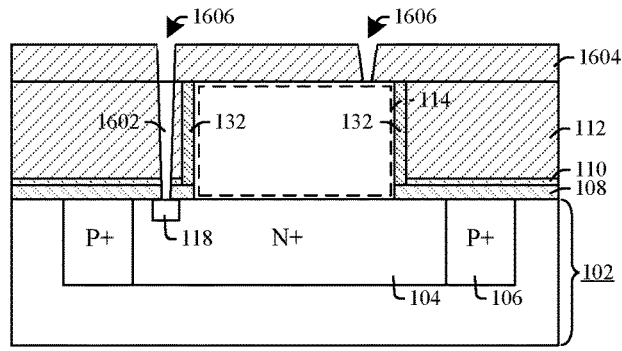

As illustrated by FIG. 16, a conductive material, such as tungsten or aluminum for example, is formed. The conductive material extends over the low-κ dielectric layer 112 and extends downward into the contact opening 1504 to make contact with the highly doped well contact region 118. A CMP operation is then carried out to planarize an upper surface of the conductive material to establish a conductive contact 1602, and then a second low-κ dielectric layer 1604 is formed and via openings 1606 are formed in the second low-κ dielectric layer 1604.

Figure 17:
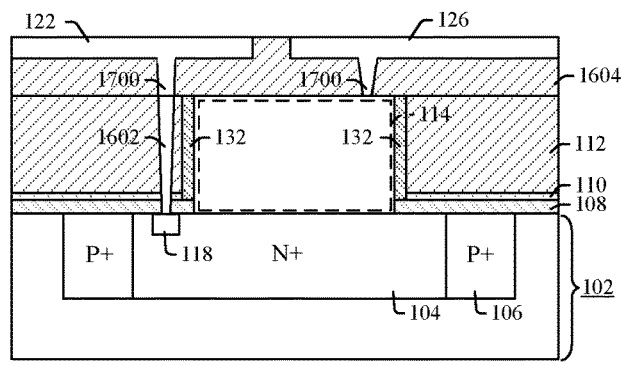

As illustrated by FIG. 17, a conductive material, such as copper aluminum for example, is formed over the second low-κ dielectric layer 1604. This conductive material extends over the second low-κ dielectric layer 1604 and extends downward into the via openings, and is planarized to form conductive vias 1700 and first and second conductive lines 122, 126.

Figure 18:
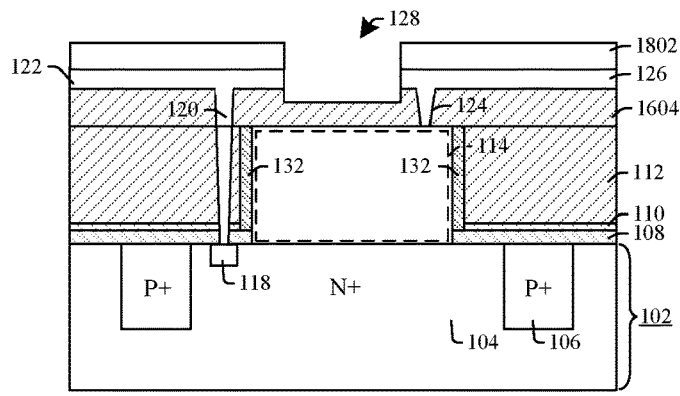

As illustrated by FIG. 18, a window recess mask 1802 is formed over the structure, and an etch is carried out to remove portions of the second low-κ dielectric layer 1604 and/or conductive lines 122, 126, to form a window opening 128 that increases the amount of impingent radiation that reaches the epitaxial pillar 114 during operation.

Figure 19:
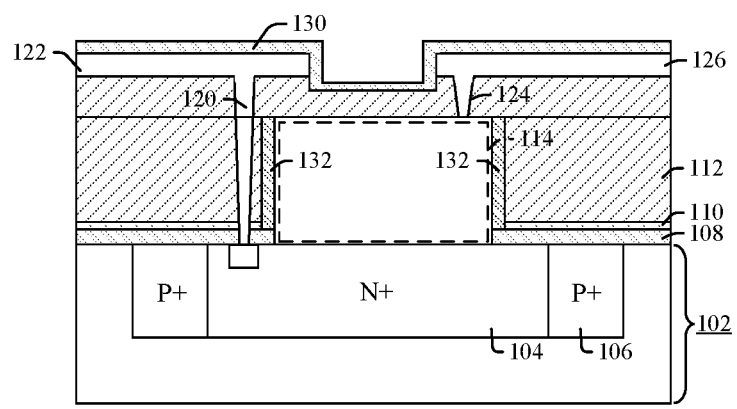

As illustrated by FIG. 19, an anti-reflective coating (ARC) 130 is formed over the upper surface of the conductive lines 122, 126 and second low-κ dielectric layer 1604. Like the window opening 128, the ARC 130 increases the amount of impingent radiation that reaches the epitaxial pillar 114 during operation. In some embodiments, the ARC 130 is a silicon nitride layer.

Figure 20:
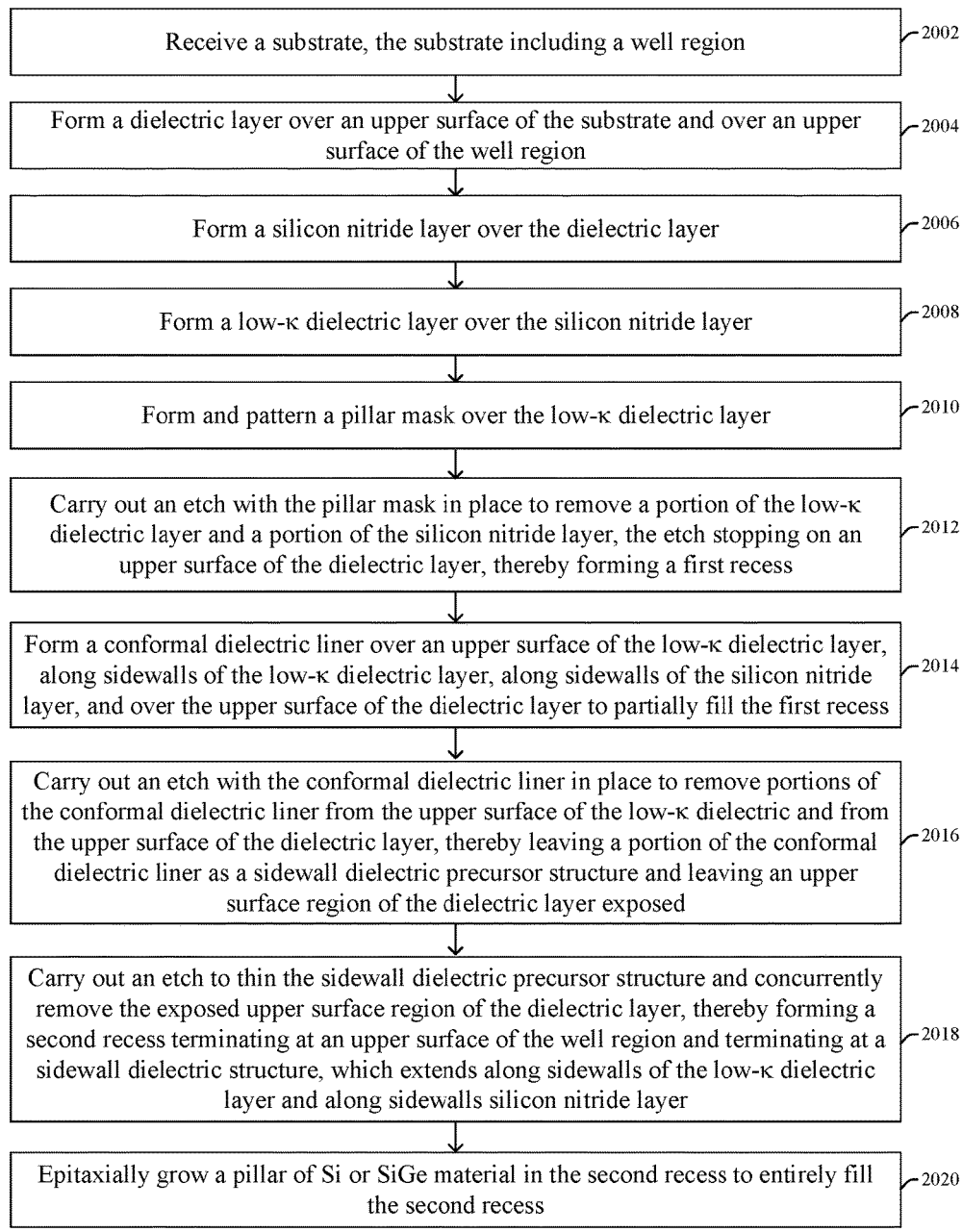
FIG. 20 illustrates a flowchart of some embodiments of a method for manufacturing a semiconductor structure consistent with some examples of FIGS. 7-19.

An example method 2000 corresponding to some embodiments of FIGS. 7-19 is now described with regard to a flowchart of FIG. 20. However, it will be appreciated that the structures disclosed in FIGS. 7-19 are not limited to the method 2000 of FIG. 20, but instead may stand alone as structures independent of the method. Similarly, although the method of FIG. 20 is described in relation to FIGS. 7-19 it will be appreciated that the method is not limited to the structures disclosed in FIGS. 7-19 but instead may stand alone independent of the structures disclosed in FIGS. 7-19. In addition, while the method 2000 described by FIG. 20 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 2002, a substrate, which includes a well region, is received. In some embodiments, act 2002 can correspond, for example, to FIG. 7.

At 2004, a dielectric layer is formed over an upper surface of the substrate and over an upper surface of the well region. In some embodiments, act 2004 can correspond, for example, to FIG. 8.

At 2006, a silicon nitride layer is formed over the dielectric layer. In some embodiments, act 2006 can correspond, for example, to FIG. 8.

At 2008, a low-κ dielectric layer is formed over the silicon nitride layer. In some embodiments, act 2008 can correspond, for example, to FIG. 8.

At 2010, a pillar mask is formed and patterned over the low-κ dielectric layer. In some embodiments, act 2010 can correspond, for example, to FIG. 9.

At 2012, an etch is carried out with the pillar mask in place to remove a portion of the low-κ dielectric layer and a portion of the silicon nitride layer. The etch stops on an upper surface of the dielectric layer, thereby forming a first recess. In some embodiments, act 2012 can correspond, for example, to FIG. 9.

At 2014, a conformal dielectric liner is formed over an upper surface of the low-κ dielectric layer, along sidewalls of the low-κ dielectric layer, along sidewalls of the silicon nitride layer, and over the upper surface of the dielectric layer to partially fill the first recess. In some embodiments, act 2014 can correspond, for example, to FIG. 10.

At 2016, an etch is carried out with the conformal dielectric liner in place to remove portions of the conformal dielectric liner from the upper surface of the low-κ dielectric and from the upper surface of the dielectric layer, thereby leaving a portion of the conformal dielectric liner as a dielectric sidewall precursor structure and leaving an upper surface region of the dielectric layer exposed. In some embodiments, act 2016 can correspond, for example, to FIG. 11.

At 2018, an etch is carried out to thin the dielectric sidewall precursor structure and concurrently remove the exposed upper surface region of the dielectric layer, thereby forming a second recess terminating at an upper surface of the well region and terminating at a dielectric sidewall structure. The dielectric sidewall structure extends along sidewalls of the low-κ dielectric layer and along sidewalls of the silicon nitride layer. In some embodiments, act 2018 can correspond, for example, to FIG. 12.

At 2020, a pillar of Si or SiGe material is epitaxially grown in the second recess to entirely fill the second recess. In some embodiments, act 2020 can correspond, for example, to FIG. 13.

FIGS. 21-24 illustrate an alternative embodiment in accordance with some embodiments of the present disclosure.

Figure 21:
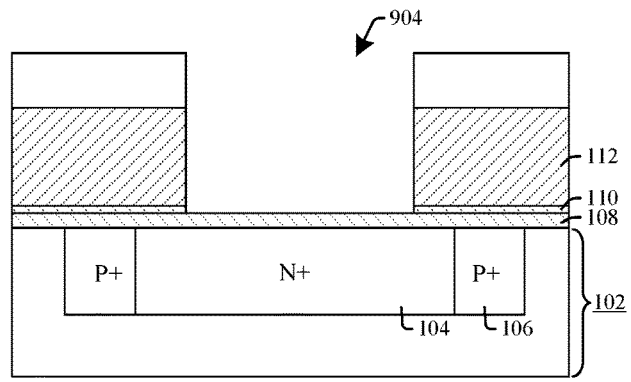
FIGS. 21-24 illustrate a series of cross-sectional views of some embodiments of a semiconductor structure at various stages of manufacture.

FIG. 21 corresponds to previously discussed FIG. 9, wherein a substrate 102 is provided. The substrate 102 includes a well region 104, which has a first conductivity type, and an isolation region 106, which can have a second conductivity type opposite the first conductivity type. A dielectric layer 108, which can act as an RPO layer in some embodiments, is formed over the upper surface of the substrate 102; and a silicon nitride layer 110, which can act as an etch stop layer in some embodiments, is formed over the dielectric layer 108. A low-κ dielectric layer 112, such as a USG or fluorosilicate glass (FSG) layer for example, is then formed over the silicon nitride layer 110. An etch is carried out with a pillar mask 902 in place to remove the exposed portion of the low-κ dielectric layer 112 and corresponding portions of the silicon nitride layer 110. The etch stops on an upper surface of the dielectric layer 108, thereby forming a first recess 904.

Figure 22:
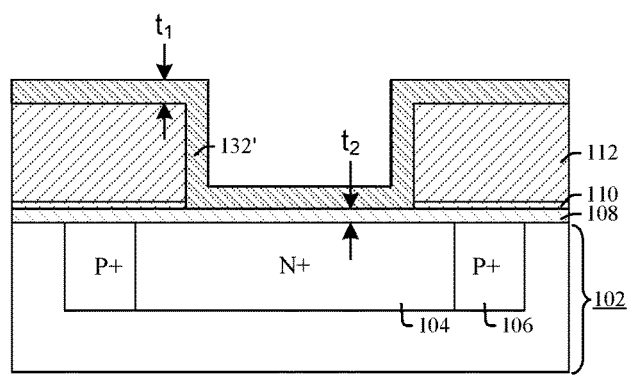

As illustrated by FIG. 22, a conformal dielectric liner 132' is then formed over an upper surface and sidewalls of the low-κ dielectric layer 112, along sidewalls of the silicon nitride layer 110, and over the upper surface of the dielectric layer 108 to partially fill the first recess 904. In some embodiments, the conformal dielectric liner 132' has a first thickness, $t_1$, and the dielectric layer has a second thickness, $t_2$, wherein the first thickness $t_1$ is greater than the second thickness, $t_2$.

Figure 23:
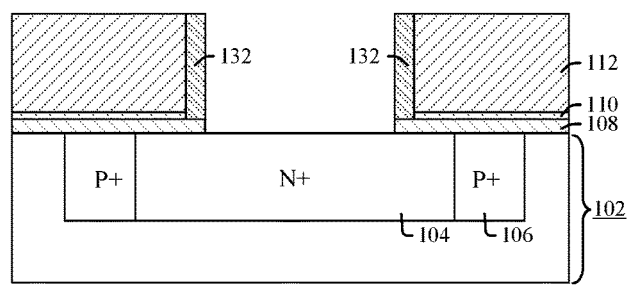

As illustrated in FIG. 23, an etch, such as a chemical dry etch (CDE) is carried out for a predetermined time to anisotropically or vertically etch the conformal dielectric liner 132' and in situ also remove the underlying portions of the dielectric layer 108 which are exposed as the etch removes the lateral portions of the conformal dielectric liner 132'. Notably, in contrast to FIGS. 11-12 (where FIG. 11 employed an anisotropic etch and FIG. 12 employed a separate wet etch), the etch in FIG. 23 is a single in situ etch used to form the dielectric sidewall structure 132. In some embodiments, this in situ etch can be carried out for a predetermined time during which the plasma chamber includes $C_4F_4$, $O_2$, and Ar gas species, for example.

Figure 24:
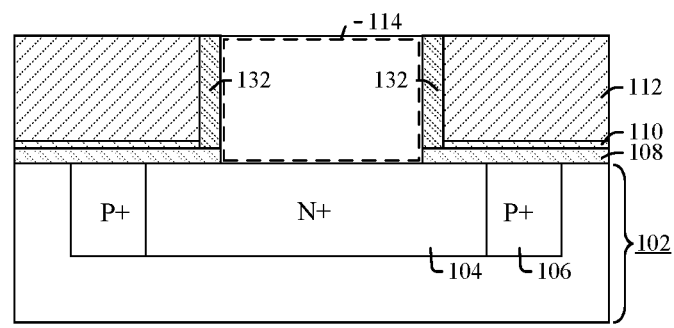

As illustrated in FIG. 24, an epitaxial pillar 114 of Ge or SiGe material is epitaxially grown directly on the well region 104 without voids or gaps, similar to as previously discussed with regards to FIG. 13. After FIG. 24, the manufacturing process can continue as illustrated and described with regards to FIGS. 14-20 to complete manufacturing of the device.

Figure 25:
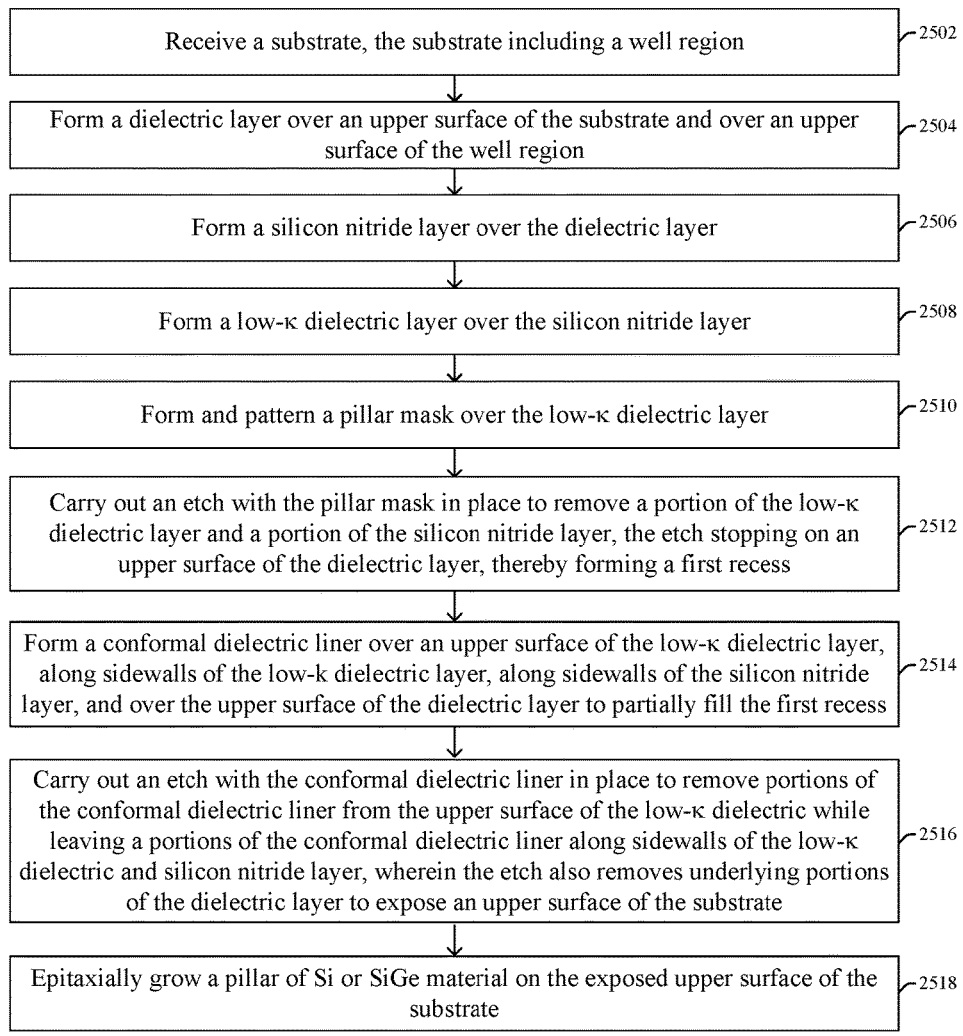
FIG. 25 illustrates a flowchart of some embodiments of a method for manufacturing a semiconductor structure consistent with some examples of FIGS. 21-24.

An example method 2500 corresponding to some embodiments employing FIGS. 21-24 is now described with regard to a flowchart of FIG. 25. As mentioned above, this method can also make use of some embodiments previously described with regards to FIGS. 7-19.

At 2502, a substrate, which includes a well region, is received. In some embodiments, act 2502 can correspond, for example, to FIG. 7.

At 2504, a dielectric layer is formed over an upper surface of the substrate and over an upper surface of the well region. In some embodiments, act 2504 can correspond, for example, to FIG. 8.

At 2506, a silicon nitride layer is formed over the dielectric layer. In some embodiments, act 2506 can correspond, for example, to FIG. 8.

At 2508, a low-κ dielectric layer is formed over the silicon nitride layer. In some embodiments, act 2508 can correspond, for example, to FIG. 8.

At 2510, a pillar mask is formed and patterned over the low-κ dielectric layer. In some embodiments, act 2510 can correspond, for example, to FIG. 21.

At 2512, an etch is carried out with the pillar mask in place to remove a portion of the low-κ dielectric layer and a portion of the silicon nitride layer. The etch stops on an upper surface of the dielectric layer, thereby forming a first recess. In some embodiments, act 2512 can correspond, for example, to FIG. 21.

At 2514, a conformal dielectric liner is formed over an upper surface of the low-κ dielectric layer, along sidewalls of the low-κ dielectric layer, along sidewalls of the silicon nitride layer, and over the upper surface of the dielectric layer to partially fill the first recess. In some embodiments, act 2514 can correspond, for example, to FIG. 22.

At 2516, an etch is carried out with the conformal dielectric liner in place to remove portions of the conformal dielectric liner from the upper surface of the low-κ dielectric while leaving a portion of the conformal dielectric liner along sidewalls of the low-κ dielectric and silicon nitride layer. In 2516, the etch also removes underlying portions of the dielectric layer to expose an upper surface of the substrate. In some embodiments, act 2516 can correspond, for example, to FIG. 23.

At 2518, a pillar of Si or SiGe material is epitaxially grown on the exposed upper surface of the substrate. In some embodiments, act 2518 can correspond, for example, to FIG. 24.

In some embodiments, the present disclosure relates to an integrated circuit (IC) disposed on a silicon substrate, which includes a well region having a first conductivity type. A dielectric layer is arranged over an upper surface of the silicon substrate, and extends over outer edges of the well region and includes an opening that leaves an inner portion of the well region exposed. An epitaxial pillar of SiGe or Ge extends upward from the inner portion of the well region. The epitaxial pillar includes a lower epitaxial region having the first conductivity type and an upper epitaxial region having a second conductivity type, which is opposite the first conductivity type. A dielectric sidewall structure surrounds the epitaxial pillar and has a bottom surface that rests on an upper surface of the dielectric layer.

Other embodiments relate to a method. In this method, a substrate, which includes a well region, is received. A dielectric layer is formed over an upper surface of the substrate and over an upper surface of the well region. A silicon nitride layer is formed over the dielectric layer, and a low-κ dielectric layer is formed over the silicon nitride layer. A portion of the low-κ dielectric layer and an underlying portion of the silicon nitride layer are selectively removed to form a first recess that exposes an upper surface of the dielectric layer. A conformal dielectric liner is formed over an upper surface of the low-κ dielectric layer, along sidewalls of the low-κ dielectric layer, along sidewalls of the silicon nitride layer, and over the exposed upper surface of the dielectric layer to partially fill the first recess. A first etch is carried out with the conformal dielectric liner in place to remove portions of the conformal dielectric liner from the upper surface of the low-κ dielectric layer and from the upper surface of the dielectric layer, thereby leaving a portion of the conformal dielectric liner as a dielectric sidewall precursor structure along sidewalls of the low-κ dielectric layer and along sidewalls of the dielectric layer and while leaving an upper surface region of the dielectric layer exposed.

Still other embodiments relate to an integrated circuit (IC). The IC includes a silicon substrate including a well region having a first conductivity type. A dielectric layer is arranged over an upper surface of the silicon substrate. The dielectric layer extends over outer edges of the well region and includes a first opening that leaves an inner portion of the well region exposed. A silicon nitride layer is arranged over the dielectric layer and includes a second opening which is aligned with the first opening and which leaves the inner portion of the well region exposed. A low-κ dielectric layer is arranged over the silicon nitride layer and includes a third opening which is aligned with the first opening and the second opening and which leaves the inner portion of the well region exposed. An epitaxial pillar of SiGe or Ge extends upward from the inner portion of the well region to an upper region of the low-κ dielectric layer. The epitaxial pillar includes a lower epitaxial region having the first conductivity type and an upper epitaxial region having a second conductivity type, which is opposite the first conductivity type. A dielectric sidewall structure surrounds the epitaxial pillar. The dielectric sidewall structure has a bottom surface that rests on an upper surface of the dielectric layer and has an upper surface proximate to the upper region of the low-κ dielectric layer.

Still other embodiments relate to a method. In this method, a substrate is received. A first dielectric layer is formed over an upper surface of the substrate, and a second dielectric layer is formed over the first dielectric layer. A portion of the second dielectric layer is selectively removed to form a first recess that exposes an upper surface of the first dielectric layer. A conformal dielectric liner is formed over an upper surface and along sidewalls of the second dielectric layer, and over the exposed upper surface of the first dielectric layer to partially fill the first recess. A first etch is carried out to remove lateral portions of the conformal dielectric liner, thereby leaving a remaining portion of the conformal dielectric liner as a dielectric sidewall precursor structure along sidewalls of the second dielectric layer while leaving an upper surface region of the first dielectric layer exposed. A thickness of the dielectric sidewall precursor structure as measured from an innermost sidewall of the dielectric sidewall precursor to a nearest sidewall of the second dielectric layer is greater than a thickness of the first dielectric layer as measured from an upper surface of the first dielectric layer to an upper surface of the substrate. A second etch, which has a different etching character than the first etch, is carried out to thin the dielectric sidewall precursor structure and concurrently remove the exposed upper surface region of the first dielectric layer, thereby forming a second recess terminating at an upper surface of the substrate. A pillar of semiconductor material is formed in the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
receiving a substrate, the substrate including a well region;
forming a dielectric layer over an upper surface of the substrate and over an upper surface of the well region;
forming a silicon nitride layer over the dielectric layer;
forming a low-κ dielectric layer over the silicon nitride layer;
selectively removing a portion of the low-κ dielectric layer and an underlying portion of the silicon nitride layer to form a first recess that exposes an upper surface of the dielectric layer;
forming a conformal dielectric liner over an upper surface of the low-κ dielectric layer, along sidewalls of the low-κ dielectric layer, along sidewalls of the silicon nitride layer, and over the exposed upper surface of the dielectric layer to partially fill the first recess; and
carrying out a first etch with the conformal dielectric liner in place to remove portions of the conformal dielectric liner from the upper surface of the low-κ dielectric layer and from the upper surface of the dielectric layer, thereby leaving a portion of the conformal dielectric liner as a dielectric sidewall precursor structure along sidewalls of the low-κ dielectric layer and along sidewalls of the dielectric layer and while leaving an upper surface region of the dielectric layer exposed.

2. The method of claim 1, wherein a thickness of the dielectric sidewall precursor structure as measured from an innermost sidewall of the dielectric sidewall precursor structure to the silicon nitride layer is greater than a thickness of the dielectric layer as measured from an upper surface of the dielectric layer to an upper surface of the substrate.

3. The method of claim 1, further comprising:
carrying out a second etch, which is different from the first etch, to thin the dielectric sidewall precursor structure and concurrently remove the exposed upper surface region of the dielectric layer, thereby forming a second recess terminating at an upper surface of the well region.

4. The method of claim 3, further comprising:
epitaxially growing a pillar of Ge or SiGe material in the second recess to entirely fill the second recess without voids or gaps.

5. The method of claim 4, wherein the first etch is an anisotropic etch and the second etch is an isotropic etch.

6. The method of claim 4, wherein the dielectric sidewall precursor structure and the dielectric layer have the same dielectric material composition as one another.

7. The method of claim 4, wherein the dielectric sidewall precursor structure has a first etch rate and the dielectric layer has a second etch rate that differs from the first etch rate for the second etch.

8. The method of claim 7, wherein the second etch rate is less than the first etch rate by thirty percent or less.

9. A method, comprising:
receiving a substrate;
forming a first dielectric layer over an upper surface of the substrate;
forming a second dielectric layer over the first dielectric layer;
selectively removing a portion of the second dielectric layer to form a first recess that exposes an upper surface of the first dielectric layer;
forming a conformal dielectric liner over an upper surface and along sidewalls of the second dielectric layer, and over the exposed upper surface of the first dielectric layer to partially fill the first recess;
carrying out a first etch to remove lateral portions of the conformal dielectric liner, thereby leaving a remaining portion of the conformal dielectric liner as a dielectric sidewall precursor structure along sidewalls of the second dielectric layer while leaving an upper surface region of the first dielectric layer exposed, wherein a thickness of the dielectric sidewall precursor structure as measured from an innermost sidewall of the dielectric sidewall precursor structure to a nearest sidewall of the second dielectric layer is greater than a thickness of the first dielectric layer as measured from an upper surface of the first dielectric layer to an upper surface of the substrate;
carrying out a second etch, which has a different etching character than the first etch, to thin the dielectric sidewall precursor structure and concurrently remove the exposed upper surface region of the first dielectric layer, thereby forming a second recess terminating at an upper surface of the substrate; and
forming a pillar of semiconductor material in the second recess.

10. A method of forming an integrated circuit (IC), comprising:
receiving a substrate including a well region having a first conductivity type;
forming a first dielectric layer over an upper surface of the substrate, the first dielectric layer extending over outer edges of the well region;
forming a second dielectric layer over an upper surface of the first dielectric layer;
forming an opening in the second dielectric layer;
forming a dielectric sidewall structure in the opening along inner sidewalls of the second dielectric layer, the dielectric sidewall structure having a bottom surface that rests on an upper surface of the first dielectric layer;
with the dielectric sidewall structure in place, removing a portion of the first dielectric layer to extend the opening and leave an inner portion of the well region exposed; and
forming an epitaxial pillar of SiGe or Ge extending upward from the inner portion of the well region, the epitaxial pillar including a lower epitaxial region having the first conductivity type and an upper epitaxial region having a second conductivity type, which is opposite the first conductivity type.

11. The method of claim 10, wherein the first dielectric layer and dielectric sidewall structure have the same dielectric material composition as one another.

12. The method of claim 10, wherein the first dielectric layer has a first etch rate and the dielectric sidewall structure has a second etch rate that differs from the first etch rate for a predetermined etch, and wherein the first etch rate is between 70% and 130% of the second etch rate.

13. The method of claim 10, wherein the upper and lower epitaxial regions of the epitaxial pillar correspond to a photodiode configured to absorb incident radiation at a predetermined wavelength or range of wavelengths, the method further comprising:

forming an aluminum copper layer over the substrate, wherein the aluminum copper layer includes an opening aligned over an upper surface of the epitaxial pillar and through which the incident radiation may pass through the aluminum copper layer to read the photodiode; and forming an anti-reflective coating over the aluminum copper layer and lining the opening of the aluminum copper layer.

14. The method of claim 10, wherein inner sidewalls of the dielectric sidewall structure have rounded upper surfaces, and where an upper surface of the epitaxial pillar flares outward over the rounded upper surfaces.

15. The method of claim 10, wherein the first dielectric layer has innermost sidewalls that are aligned with innermost sidewalls of the dielectric sidewall structure.

16. The method of claim 10, further comprising:

forming a silicon nitride layer over the dielectric layer, the silicon nitride layer having an inner sidewall that is spaced apart from an outer sidewall of the epitaxial pillar by the dielectric sidewall structure.

17. The method of claim 16, further comprising:

forming a low-κ dielectric layer over the silicon nitride layer;

wherein an upper surface of the low-κ dielectric layer is co-planar with both an upper surface of the dielectric sidewall structure and an upper surface of the epitaxial pillar.

18. The method of claim 16, wherein a lower surface of the dielectric sidewall structure is co-planar with a lower surface of the silicon nitride layer.

19. The method of claim 16, wherein the epitaxial pillar further comprises an intrinsic region of Si or SiGe separating the lower epitaxial region from the upper epitaxial region.

20. The method of claim 19, wherein a lowermost portion of the intrinsic region has a first height, as measured from an upper surface of the substrate, and wherein a lowermost portion of the silicon nitride layer has a second height that is less than the first height.

* * * * *